(12) United States Patent
Tsuchiya et al.

(10) Patent No.: US 8,790,469 B2
(45) Date of Patent: Jul. 29, 2014

(54) TREATING APPARATUS, TREATING METHOD AND RECORDING MEDIUM

(75) Inventors: Takafumi Tsuchiya, Tosu (JP); Tohru Iwabae, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 607 days.

(21) Appl. No.: 12/644,673

(22) Filed: Dec. 22, 2009

(65) Prior Publication Data

US 2010/0163077 A1 Jul. 1, 2010

(30) Foreign Application Priority Data

Dec. 26, 2008 (JP) ................................. 2008-332795

(51) Int. Cl.
*B08B 3/00* (2006.01)

(52) U.S. Cl.
USPC ........................................................ 134/56 R

(58) Field of Classification Search
USPC ............................................................ 134/61
See application file for complete search history.

(56) References Cited

U.S. PATENT DOCUMENTS 6,694,218 B2 * 2/2004 Oh ................................. 700/217
6,745,783 B2 6/2004 Nakatou

FOREIGN PATENT DOCUMENTS

| JP | 10-275844 A | 10/1998 |
| JP | 2000-277401 A | 10/2000 |
| JP | 2002-118086 A | 4/2002 |
| JP | 2003-059891 A | 2/2003 |

* cited by examiner

*Primary Examiner* — David Cormier
(74) *Attorney, Agent, or Firm* — Abelman, Frayne & Schwab (57) ABSTRACT

Disclosed is a treating apparatus capable of improving the throughput during successive processing of target objects without a bad influence on the target objects. The disclosed treating apparatus includes an extendable liquid treating mechanism, and a common handling unit for handling one target object and another target object in order. The treating apparatus includes a recipe producing unit for producing a recipe having a rinsing liquid treatment and a common handling. When one common handling for handling one target object by the common handling unit and another common handling for handling another target object by the common handling unit are temporally overlapped with each other, the recipe producing unit extends the extendable liquid treatment for another target object, and shifts another common handling to an extent that the extendable liquid treatment is extended, thereby avoiding the temporal overlapping of one common handling with another common handling.

9 Claims, 7 Drawing Sheets

TREATING APPARATUS, TREATING METHOD AND RECORDING MEDIUM

This application is based on and claims priority from Japanese Patent Application No. 2008-332795, filed on Dec. 26, 2008, with the Japanese Patent Office, the disclosure of which is incorporated herein in its entirety by reference.

TECHNICAL FIELD

The present disclosure relates to a treating apparatus for treating a target object, a treating method using the treating apparatus, a computer program for executing the treating method, and a recording medium for storing the computer program.

BACKGROUND

There has been known a cleaning method of sequentially dipping multiple wafers (hereinafter, referred to as a wafer set) as target objects in a chemical liquid reservoir storing a chemical liquid or a rinsing liquid reservoir storing a rinsing liquid, thereby removing contaminants adhered to respective wafers. Also, in order to sequentially dip the wafer set in the chemical liquid reservoir or the rinsing liquid reservoir, a carrying device is used. Also, as disclosed in Japanese Laid-Open Patent Publication No. 2002-118086, such a carrying device functions as a common handling unit for sequentially handling the wafer set.

In sequentially processing multiple wafer sets, when one wafer set uses the carrying device (the common handling unit), another wafer set cannot be carried by the carrying device (the common handling unit). Thus, a recipe is required to be adjusted in such a manner that while one wafer set does not use the carrying device, another wafer set can use the carrying device. However, depending on the content of the recipe, the time for allowing another wafer set to use the carrying device cannot be secured. As a result, the recipe for another wafer set is required to be largely delayed.

SUMMARY

According to one embodiment, there is provided a treating apparatus including an extendable liquid treating mechanism to treat a target object with a liquid, a common handling unit to handle one target object and another target object in order, and a recipe producing unit to produce a recipe having an extendable liquid treatment for treating the target object by the extendable liquid treating mechanism and a common handling to handle the target object by the common handling unit. When one common handling for handling one target object by the common handling unit and another common handling for handling another target object by the common handling unit are temporally overlapped with each other, the recipe producing unit extends the extendable liquid treatment for another target object, and shifts another common handling to an extent that the extendable liquid treatment is extended, thereby avoiding temporal overlapping of one common handling with another common handling.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a treating apparatus, a treating method, a computer program and a recording medium, which can improve the throughput during successive processing of target objects without a bad influence on the target objects.

According to one embodiment, there is provided a treating apparatus including an extendable liquid treating mechanism to treat a target object with a liquid, a common handling unit to handle one target object and another target object in order, and a recipe producing unit to produce a recipe having an extendable liquid treatment for treating the target object by the extendable liquid treating mechanism and a common handling to handle the target object by the common handling unit. When one common handling for handling one target object by the common handling unit and another common handling for handling another target object by the common handling unit are temporally overlapped with each other, the recipe producing unit extends the extendable liquid treatment for another target object, and shifts another common handling to an extent that the extendable liquid treatment is extended, thereby avoiding temporal overlapping of one common handling with another common handling.

The treating apparatus may further include a chemical liquid treating mechanism to treat the target object with a chemical liquid, wherein the recipe produced by the recipe producing unit may further include a chemical liquid treatment to treat the target object by the chemical liquid treating mechanism.

The extendable liquid treating mechanism may be provided with a rinsing liquid treating mechanism to treat the target object with a rinsing liquid.

The extendable liquid treating mechanism may be provided with a stripping liquid treating mechanism to treat the target object with a stripping liquid.

The common handling unit may be provided with an ozone water supply unit to supply ozone water to the chemical liquid treating mechanism.

The common handling unit may be provided with an ozone water supply unit to supply ozone water to the rinsing liquid treating mechanism.

The common handling unit may be provided with a heated DIW supply unit to supply heated deionized water to the rinsing liquid treating mechanism.

The common handling unit may be provided with a carrying device to move the target object.

The extendable liquid treating mechanism may include multiple extendable liquid treating units, and sum of times extended in the multiple extendable liquid treating units equals to a shifted time of the common handling.

According to another embodiment, there is provided a treating method that includes an extendable liquid treating to treat the target object with a liquid by an extendable liquid treating mechanism, one common handling to handle one target object by a common handling unit, and another common handling to handle another target object by the common handling unit. When one common handling and another common handling are temporally overlapped with each other, the extendable liquid treating for another target object is extended and another common handling is shifted to an extent that the extendable liquid treating is extended so that temporal overlapping of one common handling with another common handling is avoided.

According to another embodiment, there is provided a computer program to execute a treating method in a treating apparatus having an extendable liquid treating mechanism and a common handling unit, wherein the treating method includes an extendable liquid treating to treat the target object with a liquid by an extendable liquid treating mechanism, one common handling to handle one target object by a common handling unit, and another common handling, after the one common handling, to handle another target object by the common handling unit. When one common handling and another common handling are temporally overlapped with each other, the extendable liquid treating for another target object is extended and another common handling is shifted to an extent that the extendable liquid treating is extended so that temporal overlapping of one common handling with another common handling is avoided.

According to another embodiment, there is provided a recording medium storing a computer program to execute a treating method in a treating apparatus having an extendable liquid treating mechanism and a common handling unit, wherein the treating method includes an extendable liquid treatment to treat the target object with a liquid by an extendable liquid treating mechanism, one common handling to handle one target object by a common handling unit, and another common handling to handle another target object by the common handling unit. When one common handling and another common handling are temporally overlapped with each other, the extendable liquid treatment for another target object is extended, and another common handling is shifted to an extent that the extendable liquid treatment is extended, so that temporal overlapping of one common handling with another common handling is avoided.

According to the present disclosure, when one common handling for handling one target object by a common handling unit and another common handling for handling another target object by the common handling unit are temporally overlapped with each other, the extendable liquid treatment for another target object is extended, and another common handling is shifted to an extent that the extendable liquid treatment is extended, thereby avoiding the temporal overlapping of one common handling with another common handling. Accordingly, it is possible to improve the throughput during successive processing of target objects without a bad influence on the target objects.

First Embodiment

Hereinafter, a treating apparatus, a treating method, a computer program, and a recording medium, according to a first embodiment of the present disclosure, will be described with reference to drawings. Herein, FIGS. 1 to 3a and 3b are views illustrating the first embodiment of the present disclosure.

Figure 1:
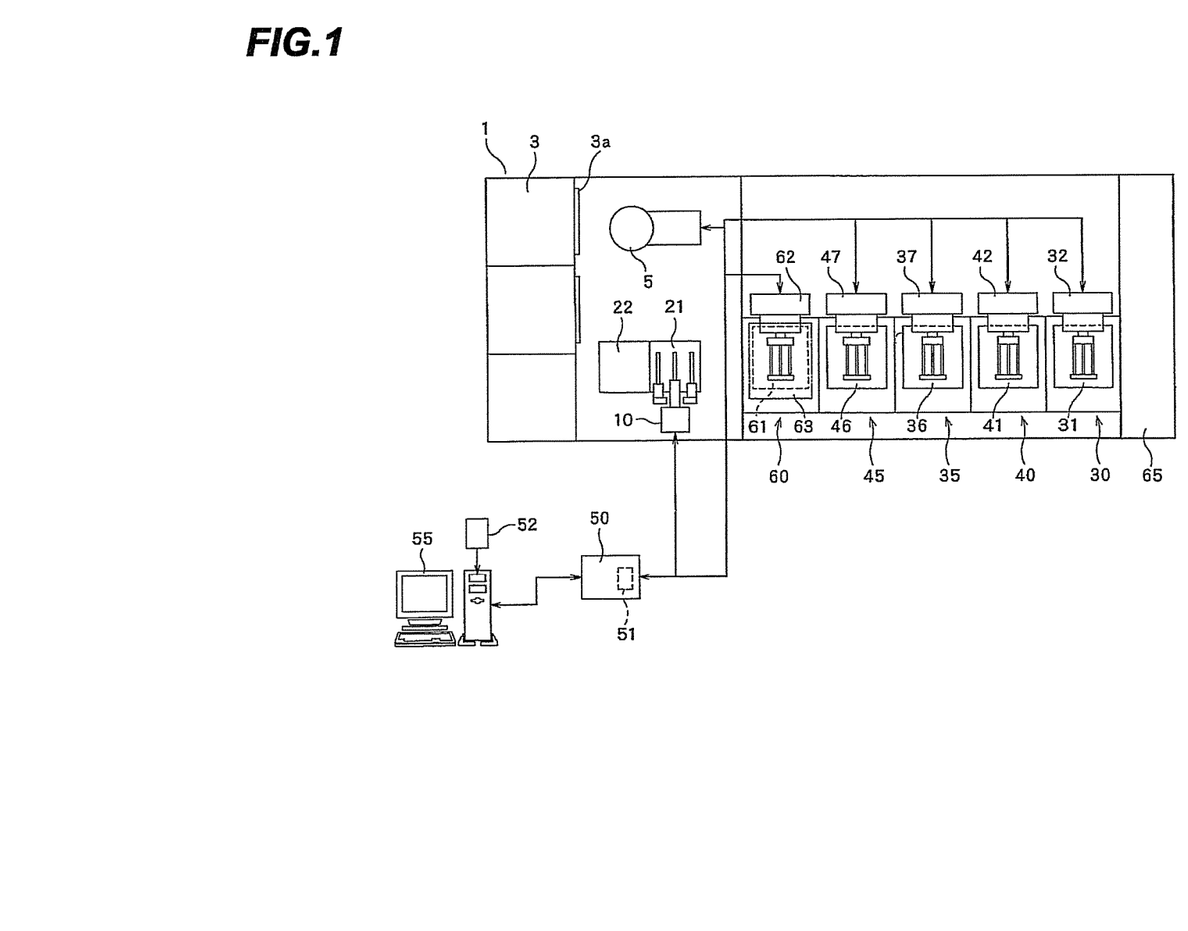
FIG. 1 is a schematic view illustrating the configuration of a treating apparatus according to a first embodiment of the present disclosure.

As shown in FIG. 1, the treating apparatus includes a case 1, a carrier loading/unloading unit (not shown), which is provided in case 1, for loading and unloading a carrier (not shown) which houses multiple wafers (hereinafter, referred to as a wafer set), a carrier stock unit (not shown) for receiving the carrier from the carrier loading/unloading unit and storing the carrier, a carrier loading/unloading stage 3 on which the wafer set stored in the carrier stock unit is moved during the treatment, a first carrying device 5 for taking the wafer set from carrier loading/unloading stage 3, and a loader part 21 for receiving the wafer set from first carrying device 5. From among the components, carrier loading/unloading stage 3 has a carrier loading door 3a, which is opened when first carrying device 5 reaches carrier loading/unloading stage 3, and is closed when first carrying device 5 moves away.

As shown in FIG. 1, the treating apparatus includes a chemical liquid treating mechanism having a first chemical liquid treating unit 30 for treating a wafer with a first chemical liquid, and a second chemical liquid treating unit 35 for treating the wafer with a second chemical liquid, and a rinsing liquid treating mechanism having a first rinsing liquid treating unit 40 for treating the wafer with a first rinsing liquid, and a second rinsing liquid treating unit 45 for treating the wafer with a second rinsing liquid.

From among the above mentioned components, first chemical liquid treating unit 30 has a first chemical liquid reservoir 31 storing a first chemical liquid, and a first chemical liquid elevating device 32 for receiving a wafer set from a second carrying device 10 described below and carrying the wafer set into first chemical liquid reservoir 31. Second chemical liquid treating unit 35 has a second chemical liquid reservoir 36 storing a second chemical liquid, and a second chemical liquid elevating device 37 for receiving the wafer set from second carrying device 10 and carrying the wafer set into second chemical liquid reservoir 36.

First rinsing liquid treating unit 40 has a first rinsing liquid reservoir 41 storing a first rinsing liquid, and a first rinsing liquid elevating device 42 for receiving the wafer set from second carrying device 10 and carrying the wafer set into first rinsing liquid reservoir 41. Second rinsing liquid treating unit 45 has a second rinsing liquid reservoir 46 storing a second rinsing liquid, and a second rinsing liquid elevating device 47 for receiving the wafer set from second carrying device 10 and carrying the wafer set into second rinsing liquid reservoir 46.

In the present disclosure, the chemical liquid means an etching liquid and the like except for the stripping liquid to be mentioned below. For example, concentrated hydrofluoric acid, diluted hydrofluoric acid, ammonia-hydrogen peroxide solution (SC1), hydrochloric acid-hydrogen peroxide solution (SC2) or phosphoric acid may be used as the chemical liquid. Meanwhile, for example, deionized water (DIW) or ozone water may be used as the rinsing liquid. In the present embodiment, diluted hydrofluoric acid is used as the first chemical liquid, SC1 is used as the second chemical liquid, and deionized water is used as the first and second rinsing liquids.

As shown in FIG. 1, the treating apparatus includes a drying unit 60 for drying the wafer, which is provided at the position adjacent to second rinsing liquid treating unit 45, and a carrying device washing unit 65 for washing second carrying device (carrying device) 10 described below, which is provided at the position adjacent to first chemical liquid treating unit 30.

Drying unit 60 according to the present embodiment, as shown in FIG. 1, has a third rinsing liquid reservoir 61 storing a third rinsing liquid (deionized water in the present embodiment), a drying chamber 63 provided above third rinsing liquid reservoir 61, a shutter (not shown) openably/closably provided between third rinsing liquid reservoir 61 and drying chamber 63, and a drying elevating device 62 which is elevated between third rinsing liquid reservoir 61 and drying chamber 63. In drying chamber 63, a drying liquid supply unit (not shown) for supplying a drying liquid, such as IPA, and an inert gas supply unit (not shown) for supplying inert gas, such as $N_2$, are provided.

As shown in FIG. 1, the treating apparatus includes second carrying device (carrying device) 10 which lifts up the wafer set loaded in loader part 21 from loader part 21, and moves the wafer set between carrying device washing unit 65, first chemical liquid treating unit 30, first rinsing liquid treating unit 40, second chemical liquid treating unit 35, second rinsing liquid treating unit 45 and drying unit 60. In the present embodiment, second carrying device 10 includes a common handling unit for sequentially handling one wafer set and another wafer set.

As shown in FIG. 1, the treating apparatus includes an unloader part 22 for receiving the wafer set which has been dried in drying unit 60 from second carrying device 10. The wafer set loaded in unloader part 22 is lifted up by first carrying device 5 and is carried to carrier loading/unloading stage 3.

Meanwhile, in the present embodiment, the computer program for executing the treating method described below is stored in a recording medium 52 (see FIG. 1). The treating apparatus is provided with a computer 55 storing recording medium 52, and a control device 50 for controlling the treating apparatus itself by receiving a signal from computer 55. Accordingly, when recording medium 52 is inserted in (or attached to) computer 55, the series of liquid treating steps described below can be executed in the treating apparatus by control device 50. In the present disclosure, recording medium 52 includes CD, DVD, MD, hard disk, RAM, etc.

Figure 3:
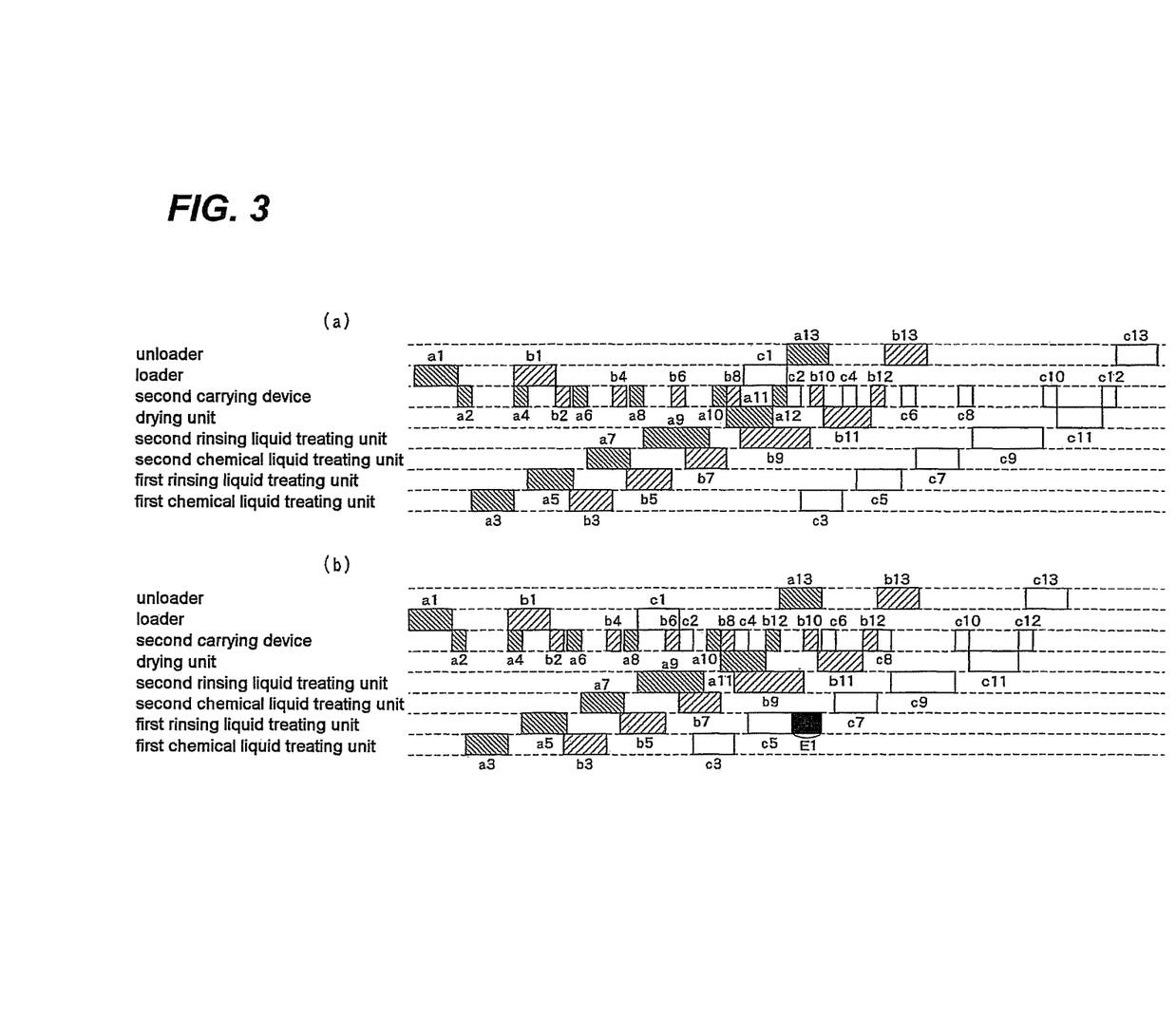
FIG. 3 is a view illustrating a recipe produced by a recipe producing unit in a treating apparatus according to a first embodiment of the present disclosure

Control device 50 includes a recipe producing unit 51 for producing a recipe having loader loading steps a1, b1, and c1, first chemical liquid carrying steps a2, b2, and c2, first chemical liquid treating steps a3, b3, and c3, first rinsing liquid carrying steps a4, b4, and c4, first rinsing liquid treating steps a5, b5, and c5, second chemical liquid carrying steps a6, b6, and c6, second chemical liquid treating steps a7, b7, and c7, second rinsing liquid carrying steps a8, b8, and c8, second rinsing liquid treating steps a9, b9, and c9, drying carrying steps a12, b10, and c10, third rinsing liquid treating steps a11, b11, and c11, drying treating steps a12, b12, and c12, and unloader loading steps a13, b13, and c13 (see FIGS. 1, 3a, and 3b).

Hereinafter, the operation of the present embodiment having the above described configuration will be described.

First, first carrying device 5 reaches carrier loading/unloading stage 3, and thereby carrier loading door 3a is placed in an open state. Then, a wafer set (for example, 25 wafers) loaded in carrier loading/unloading stage 3 is taken by first carrying device 5, and carrier loading door 3a is placed in a closed state (see FIG. 1).

Then, first carrying device 5 rotates toward loader part 21 by 90° while rotating the wafer set in such a manner that wafer surfaces can be vertically placed. Thereafter, the wafer set with vertically placed surfaces is loaded in loader part 21 (see FIG. 1).

Then, the above described steps are repeatedly carried out so as to further load multiple wafers, for example, 25 wafers in loader part 21. Herein, the previously loaded wafer and the wafer to be sequentially loaded are loaded in a nested manner, thereby forming a wafer set with a half pitch of wafers received in the carrier (loader loading steps a1, b1, and c1; see FIGS. 3a and 3b).

Figure 2:
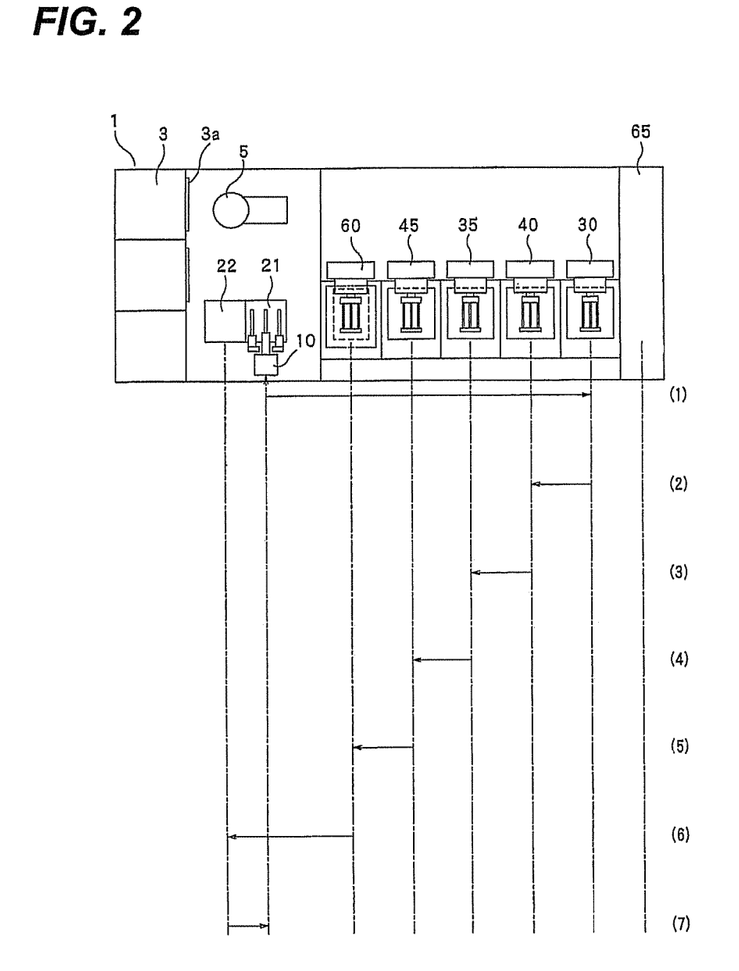
FIG. 2 is a schematic view illustrating a treating method performed by a treating apparatus according to a first embodiment of the present disclosure.

Then, a wafer set (one target object) including multiple wafers, for example, 50 wafers is lifted up from loader part 21 by second carrying device 10 and then is carried into first chemical liquid treating unit 30 (first chemical liquid carrying steps a2, b2, and c2; see FIGS. 2(1), 3a, and 3b). Further, in first chemical liquid treating unit 30, the wafer set is taken from second carrying device 10 by first chemical liquid elevating device 32 and is carried into first chemical liquid reservoir 31 (see FIG. 1). Accordingly, the wafer set is treated with diluted hydrofluoric acid as the first chemical liquid (first chemical liquid treating steps a3, b3, and c3; see FIGS. 3a and 3b).

Then, the wafer set is lifted up by first chemical liquid elevating device 32 and is unloaded from the inside of first chemical liquid reservoir 31. Further, the wafer set is taken from first chemical liquid elevating device 32 by second carrying device 10 and is carried into first rinsing liquid treating unit 40 (first rinsing liquid carrying steps a4, b4, and c4; see FIGS. 2(2) and 3a, and 3b).

Then, in first rinsing liquid treating unit 40, the wafer set is taken from second carrying device 10 by first rinsing liquid elevating device 42 and is carried into first rinsing liquid reservoir 41 (see FIG. 1). Accordingly, the wafer set is treated with deionized water as the first rinsing liquid (first rinsing liquid treating steps a5, b5, and c5; see FIGS. 3a, and 3b).

Then, the wafer set is lifted up by first rinsing liquid elevating device 42 and is unloaded from the inside of first rinsing liquid reservoir 41. Further, the wafer set is taken from first rinsing liquid elevating device 42 by second carrying device 10 and is carried into second chemical liquid treating unit 35 (second chemical liquid carrying steps a6, b6, and c6; see FIGS. 2(3) and 3a, and 3b).

Then, in second chemical liquid treating unit 35, the wafer set is taken from second carrying device 10 by second chemical liquid elevating device 37 and is carried into second chemical liquid reservoir 36. Accordingly, the wafer set is treated with SC1 as the second chemical liquid (second chemical liquid treating steps a7, b7, and c7; see FIGS. 3a, and 3b).

Then, the wafer set is lifted up by second chemical liquid elevating device 37 and is unloaded from the inside of second chemical liquid reservoir 36. Further, the wafer set is taken from second chemical liquid elevating device 37 by second carrying device 10 and is carried into second rinsing liquid treating unit 45 (second rinsing liquid carrying steps a8, b8, and c8; see FIGS. 2(4) and 3a, and 3b).

Then, in second rinsing liquid treating unit 45, the wafer set is taken from second carrying device 10 by second rinsing liquid elevating device 47 and is carried into second rinsing liquid reservoir 46. Accordingly, the wafer set is treated with deionized water as the second rinsing liquid (second rinsing liquid treating steps a9, b9, and c9; see FIGS. 3a, and 3b).

Then, the wafer set is lifted up by second rinsing liquid elevating device 47 and is unloaded from the inside of second rinsing liquid reservoir 46. Further, the wafer set is taken from second rinsing liquid elevating device 47 by second carrying device 10 and is carried into drying unit 60 (drying carrying steps a10, b10, and c10; see FIGS. 2(5) and 3a, and 3b).

Then, in drying unit 60, the wafer set is taken from second carrying device 10 by drying elevating device 62 and is carried into third rinsing liquid reservoir 61. Accordingly, the wafer set is treated with deionized water as the third rinsing liquid (third rinsing liquid treating steps).

Then, the wafer set is lifted up by drying elevating device 62. Further, after a drying liquid, such as IPA, is supplied to the lifted-up wafer set, inert gas, such as $N_2$, is supplied to the wafer set, thereby drying the wafer set (a drying step). In the present embodiment, hereinafter, the above described third rinsing liquid treating step plus the drying step is referred to as a drying treating step a11, b11, and c11 (see FIGS. 3a and 3b).

Then, the wafer set is taken from drying elevating device 62 by second carrying device 10, and the taken wafer set is carried to unloader part 22 (unloader carrying steps a12, b12, and c12), and is loaded in unloader part 22 (unloader loading steps a13, b13, and c13; see FIGS. 2(6) and 3a, and 3b). Thereafter, the wafer set is lifted up by first carrying device 5 and is carried to carrier loading/unloading stage 3. Meanwhile, when the wafer set is transferred to unloader part 22 from second carrying device 10, second carrying device 10 is moved to loader part 21 (see FIG. 2(7)).

The above described series of steps are also performed on a next target wafer set (another target object). In order to increase the throughput, the step for treating the first target wafer set (one target object), and the step for treating the next target wafer set (another target object) are carried out at intervals.

In the following detailed description, for illustrative purposes, a step performed on the first target wafer set (first wafer set) is referred to as a pre-step, a step performed on the second target wafer set (second wafer set) is referred to as a mid-step, and a step performed on the third target wafer set (third wafer set) is referred to as a post-step.

In other words, for the first wafer set, a loader loading pre-step a1, a first chemical liquid carrying pre-step a2, a first chemical liquid treating pre-step a3, a first rinsing liquid carrying pre-step a4, a first rinsing liquid treating pre-step a5, a second chemical liquid carrying pre-step a6, a second chemical liquid treating pre-step a7, a second rinsing liquid carrying pre-step a8, a second rinsing liquid treating pre-step a9, a drying carrying pre-step a10, a drying treating pre-step a11, an unloader carrying pre-step a12, and an unloader loading pre-step a13 are sequentially carried out.

Also, for the second wafer set, a loader loading mid-step b1, a first chemical liquid carrying mid-step b2, a first chemical liquid treating mid-step b3, a first rinsing liquid carrying mid-step b4, a first rinsing liquid treating mid-step b5, a second chemical liquid carrying mid-step b6, a second chemical liquid treating mid-step b7, a second rinsing liquid carrying mid-step b8, a second rinsing liquid treating mid-step b9, a drying carrying mid-step b10, a drying treating mid-step b11, an unloader carrying mid-step b12, and an unloader loading mid-step b13 are sequentially carried out.

Also, for the third wafer set, a loader loading post-step c1, a first chemical liquid carrying post-step c2, a first chemical liquid treating post-step c3, a first rinsing liquid carrying post-step c4, a first rinsing liquid treating post-step c5, a second chemical liquid carrying post-step c6, a second chemical liquid treating post-step c7, a second rinsing liquid carrying post-step c8, a second rinsing liquid treating post-step c9, a drying carrying post-step c10, a drying treating post-step c11, an unloader carrying post-step c12, and an unloader loading post-step c13 are sequentially carried out.

When recipe producing unit 51 combines pre-determined recipes without shifting or extending the steps in such a manner that the use times of the common member, in particular, second carrying device 10, are not overlapped with each other, the result as shown in FIG. 3a is obtained.

Herein, first, the recipe for the first wafer set is determined. Then, for the second wafer set, the recipe is determined in such a manner that the carrying pre-steps a2, a4, a6, a8, a10, and a12 (hereinafter, referred to as the carrying pre-steps (a2-a12)) and the carrying mid-steps b2, b4, b6, b8, b10, and b12 (hereinafter, referred to as the carrying mid-steps (b2-b12)) are not temporally overlapped with each other. Finally, for the third wafer set, the recipe is determined in such a manner that the carrying pre-steps (a2-a12), the carrying mid-steps (b2-b12), and the carrying post-steps c2, c4, c6, c8, c10, and c12 (hereinafter, referred to as the carrying post-steps (c2-c12)) are not temporally overlapped with each other.

As described above, in the aspect shown in FIG. 3a, the steps included in the recipe are not shifted or extended while the entire recipe of the third wafer set is temporally shifted to the last stage. Thus, the processing time for the third wafer set is highly delayed, thereby reducing the throughput in successive processing of wafer sets.

In relation to this, when one carrying step for handling one target object by second carrying device 10 and another carrying step for handling another target object by second carrying device 10 are temporally overlapped with each other, recipe producing unit 51 according to the present embodiment extends the rinsing liquid treating step for another target object, and shifts other carrying steps temporally following the rinsing liquid treating step to an extent that the rinsing liquid treating step is extended, thereby avoiding the temporal overlapping of one carrying step with another carrying step.

More specifically, in accordance with the aspect as shown in FIG. 3b, recipe producing unit 51, firstly, determines a recipe for the first wafer set.

Then, recipe producing unit 51 determines a recipe for the second wafer set in such a manner that the carrying pre-steps a2-a12 and the carrying mid-steps b2-b12 are not temporally overlapped with each other. Herein, when the time for the processing step for the second wafer set is shortened to avoid the overlapping of the carrying mid-steps b6, b8, b10, and b12 following the first rinsing liquid treating mid-step b5, the first rinsing liquid treating mid-step b5 is extended, and the carrying mid-steps b6, b8, b10, and b12 are shifted.

Also, when the carrying mid-steps b10 and b12 whose overlapping is avoided are performed after the second rinsing liquid treating mid-step b9, the second rinsing liquid treating mid-step b9, instead of the first rinsing liquid treating mid-step b5, may be extended, or both the first rinsing liquid treating mid-step b5 and the second rinsing liquid treating mid-step b9 may be extended. Herein, when both the first rinsing liquid treating mid-step b5 and the second rinsing liquid treating mid-step b9 are extended, the sum of the extended times of the first rinsing liquid treating mid-step b5 and the second rinsing liquid treating mid-step b9 equals to the shifted times of the carrying mid-steps b6, b8, b10, and b12.

In relation to this, in the present embodiment, since the processing time for the second wafer set may be shortened by avoiding the overlapping of the carrying mid-steps b6, b8, b10, and b12 following the first rinsing liquid treating mid-step b5, recipe producing unit 51 produces a recipe which is determined to not temporally overlap the carrying pre-steps a2-a12 and the carrying mid-steps b2-b12 with each other without shift or extension of the steps included in the recipe.

Then, recipe producing unit 51 determines a recipe for the third wafer set in such a manner that the carrying pre-steps a2-a12, the carrying mid-steps b2-b12, and the carrying post-steps c2-c12 are not temporally overlapped with each other. Herein, when the time for the processing step for the third wafer set is shortened to avoid the overlapping of the carrying post-steps c6, c8, c10, and c12 following the first rinsing liquid treating post-step c5, the first rinsing liquid treating post-step c5 is extended, and the carrying post-steps c6, c8, c10, and c12 are shifted.

Also, when the carrying post-steps c10 and c12 whose overlapping is avoided are performed after the second rinsing liquid treating post-step, the second rinsing liquid treating post-step c9, instead of the first rinsing liquid treating post-step c5, may be extended, or both the first rinsing liquid treating post-step c5 and the second rinsing liquid treating post-step c9 may be extended. Herein, when the first rinsing liquid treating post-step c5 and the second rinsing liquid treating post-step c9 are extended, the sum of the extended times of the first rinsing liquid treating post-step c5 and the second rinsing liquid treating post-step c9 equals to the shifted times of the carrying steps.

In the present embodiment, since the processing time for the third wafer set may be shortened by avoiding the overlapping of the carrying post-steps c6, c8, c10, and c12 following the first rinsing liquid treating post-step c5, recipe producing unit 51 produces a recipe, as shown in FIG. 3b, which extends the first rinsing liquid treating post-step c5 to the extent of E1 and avoids the overlapping of the second chemical liquid carrying post-step c6 with the steps following the second chemical liquid carrying post-step c6.

Accordingly, according to the present embodiment, compared to the case where the entire recipe of the third wafer set is temporally shifted to the last stage (see FIG. 3a), it is possible to improve the throughput in successive processing of wafer sets (see FIG. 3b).

In other words, since the combination of predetermined recipes without shift or extension of steps included in the recipes cannot help generating an overlapped portion in the carrying steps a2-a12, b2-b12, and c2-c12, the later overlapping of entire recipes needs to be avoided, and thus the throughput gets poorer when successive processing of wafer sets is performed. Compared to this, the carrying steps a2-a12, b2-b12, and c2-c12 included in the recipes are appropriately shifted in the present embodiment, and thus the time not used by second carrying device 10 can be effectively used, thereby improving the throughput in successive processing of wafer sets.

Also, in the present disclosure, since a rinsing liquid treating step is set as the extended step, more specifically, the first rinsing liquid treating post-step c5, it is possible to prevent the extension's bad influence on the wafer. For example, when the time of the chemical liquid treating steps c3 and c7 is extended, there is a concern that each wafer may be over-etched by the chemical liquid. However, when the wafers are dipped in the rinsing liquid for a time longer than a prearranged time, each wafer is not subject to such a bad influence.

Although the present embodiment was described with reference to the rinsing liquid treating units 40 and 45 for supplying the rinsing liquid, the present disclosure is not limited thereto. Instead of the rinsing liquid treating units 40 and 45, a POU reservoir for supplying the rinsing liquid after the supply of the chemical liquid may be used. In the case of such a POU reservoir, since the wafer is finally treated with the rinsing liquid, there is no concern regarding over-etching.

Also, in the above described aspect, second carrying device 10 may be appropriately washed by carrying device washing unit 65.

In other words, second carrying device 10 moves between the first chemical liquid carrying steps a2, b2, and c2 (see FIG. 2(1)) and the first rinsing liquid carrying steps a4, b4, and c4 (see FIG. 2(2)), between the first rinsing liquid carrying steps a4, b4, and c4 (see FIG. 2(2)) and the second chemical liquid carrying steps a6, b6, and c6 (see FIG. 2 (3)), between the second chemical liquid carrying steps a6, b6, and c6 (see FIG. 2 (3)) and the second rinsing liquid carrying steps a8, b8, and c8 (see FIG. 2 (4)), between the second rinsing liquid carrying steps a8, b8, and c8 (see FIG. 2 (4)) and the drying carrying steps a10, b10, and c10 (see FIG. 2(5)), between the drying carrying steps a10, b10, and c10 (see FIG. 2(5)) and the unloader loading steps a13, b13, and c13 (see FIG. 2 (6)), and between the unloader loading steps a13, b13, and c13 (see FIG. 2 (6)) and the step for moving the wafer set to loader part 21 (see FIG. 2 (7)). Second carrying device 10 appropriately moves to carrying device washing unit 65, if necessary. After being washed in carrying device washing unit 65, second carrying device 10 may be returned to its original position.

Also, although in the above description, the first rinsing liquid treating steps a5, b5, and c5, and the second rinsing liquid treating steps a9, b9, and c9 are extended, the present disclosure is not limited thereto. For example, in another aspect, both or one of the third rinsing liquid treating step and the drying step may be extended. Especially, in the case of extending the drying step, in consideration of the influence on the wafer set, it is preferable to extend the step of supplying inert gas, such as $N_2$, instead of the step of supplying a drying liquid, such as IPA.

Second Embodiment

Figure 4:
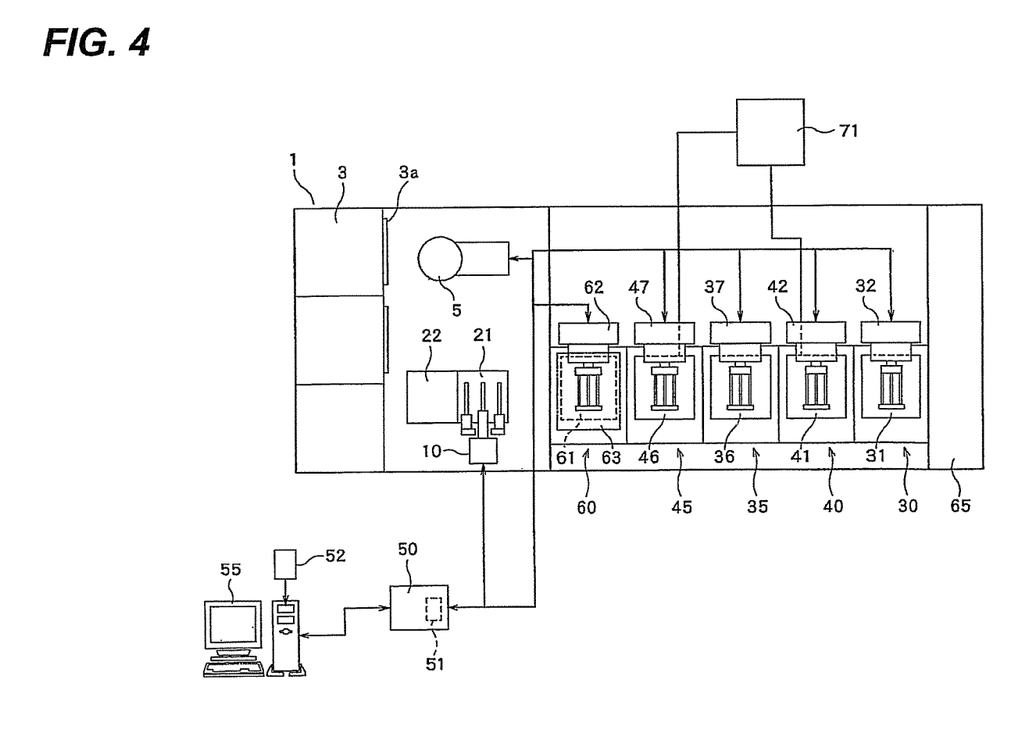
FIG. 4 is a schematic view illustrating the configuration of a treating apparatus according to a second embodiment of the present disclosure.
Figure 5:
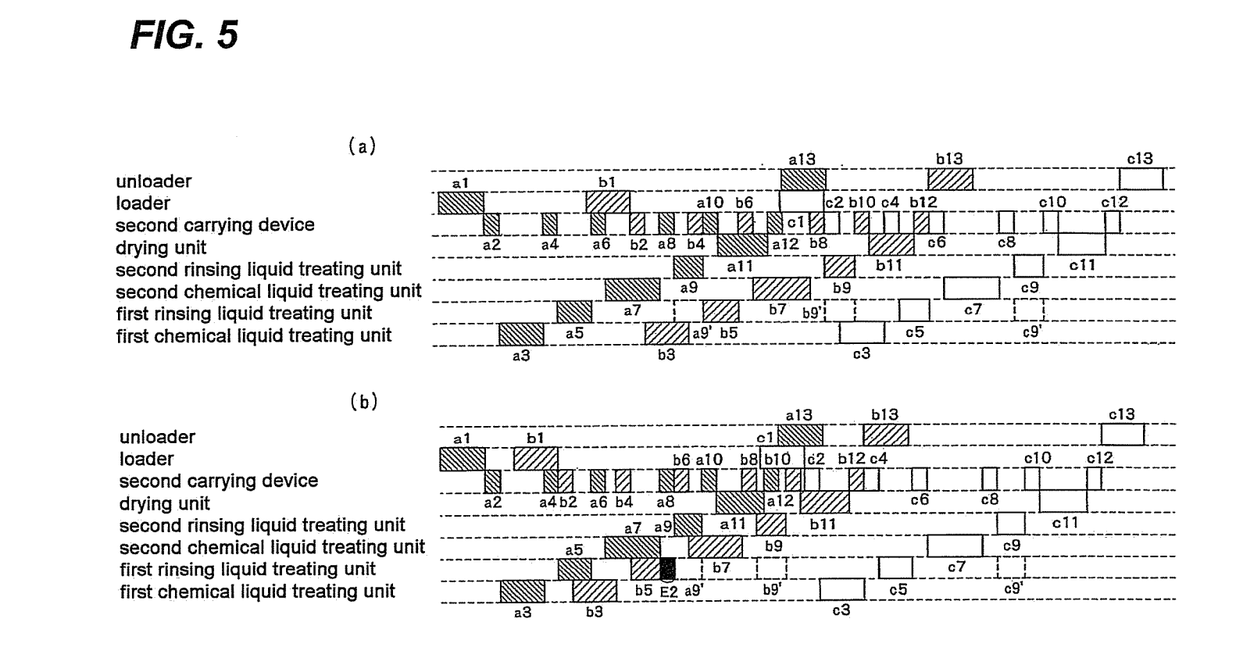
FIG. 5 is a view illustrating a recipe produced by a recipe producing unit in a treating apparatus according to a second embodiment of the present disclosure.

Hereinafter, the second embodiment of the present disclosure will be described with reference to FIGS. 4, 5a, and 5b. The treating apparatus according to the second embodiment, as shown in FIGS. 4, 5a, and 5b, further includes an ozone water supply unit 71 for supplying ozone water to first rinsing liquid treating unit 40 and second rinsing liquid treating unit 45. Ozone water supply unit 71, like second carrying device 10, functions as a common handling unit. Other configurations are almost the same as those of the first embodiment shown in FIGS. 1 to 3a and 3b.

In the second embodiment shown in FIGS. 4, 5a, and 5b, the same parts as those in the first embodiment shown in FIGS. 1 to 3a and 3b are denoted by the same numerals, and their detailed description is omitted.

In the present embodiment, during both the wafer processing in first rinsing liquid treating unit 40 and the wafer processing in second rinsing liquid treating unit 45, ozone water supply unit 71 is used. Thus, not only the carrying steps a2-a12, b2-b12, and c2-c12, but also the first rinsing liquid treating steps a5, b5, and c5 and the second rinsing liquid treating steps a9, b9, and c9 are adjusted to be not temporally overlapped (see a9', b9', and c9' indicated by dotted lines in FIGS. 5a and 5b).

When recipe producing unit 51 combines pre-determined recipes without shifting or extending the steps in such a manner that the use times of the common member (in particular, second carrying device 10, first rinsing liquid treating unit 40, and second rinsing liquid treating unit 45) are not overlapped with each other, the result as shown in FIG. 5a is obtained.

Herein, first, the recipe for the first wafer set is determined. Then, for the second wafer set, the recipe is determined in such a manner that the carrying steps a2-a12 and b2-b12 are not temporally overlapped with each other and the first rinsing liquid treating steps a5 and b5 and the second rinsing liquid treating steps a9 and b9 are not temporally overlapped with each other. Finally, for the third wafer set, the recipe is determined in such a manner that the carrying steps a2-a12, b2-b12, and c2-c12 are not temporally overlapped with each other and the first rinsing liquid treating steps a5, b5, and c5, and the second rinsing liquid treating steps a9, b9, and c9 are not temporally overlapped with each other.

As described above, in the aspect shown in FIG. 5a, the steps included in the recipe are not shifted or extended while the entire recipe of the third wafer set is temporally shifted to the last stage. Thus, the processing time for the third wafer set is highly delayed, thereby reducing the throughput in successive processing of wafer sets.

In relation to this, when one carrying step for handling one target object by second carrying device 10 and another carrying step for handling another target object by second carrying device 10 are temporally overlapped with each other, or when one first rinsing liquid treating step and one second rinsing liquid treating step for handling one target object by ozone water supply unit 71 and another first rinsing liquid treating step and another second rinsing liquid treating step for handling another target object by ozone water supply unit 71 are temporally overlapped with each other, recipe producing unit 51 according to the present embodiment extends the rinsing liquid treating step for another target object, and shifts other carrying steps temporally following the rinsing liquid treating step to an extent that the rinsing liquid treating step is extended, thereby avoiding the temporal overlapping of carrying steps and the temporal overlapping of the first rinsing liquid treating step with the second rinsing liquid treating step.

More specifically, in accordance with the aspect as shown in FIG. 5b, recipe producing unit 51, firstly, determines a recipe for the first wafer set.

Then, recipe producing unit 51 determines a recipe for the second wafer set in such a manner that the carrying steps a2-a12 and b2-b12 are not temporally overlapped with each other and the first rinsing liquid treating steps a5 and b5 and the second rinsing liquid treating steps a9 and b9 are not temporally overlapped with each other. Herein, when the time for the processing step for the second wafer set is shortened to avoid the overlapping of the carrying mid-steps following the first rinsing liquid treating mid-step b5, the first rinsing liquid treating mid-step b5 is extended, and the carrying mid-steps b6, b8, b10, and b12 are shifted.

Also, when the carrying mid-steps b10 and b12 whose overlapping is avoided are performed after the second rinsing liquid treating mid-step b9, the second rinsing liquid treating mid-step b9, instead of the first rinsing liquid treating mid-step b5, may be extended, or both the first rinsing liquid treating mid-step b5 and the second rinsing liquid treating mid-step b9 may be extended. Herein, when both the first rinsing liquid treating mid-step b5 and the second rinsing liquid treating mid-step b9 are extended, the sum of the extended times of the first rinsing liquid treating mid-step b5 and the second rinsing liquid treating mid-step b9 equals to the shifted times of the carrying steps.

In the present embodiment, since the processing time for the second wafer set may be shortened by avoiding the overlapping of the carrying post-steps c6, c8, c10, and c12 following the first rinsing liquid treating post-step c5, recipe producing unit 51 produces a recipe, as shown in FIG. 5b, which extends the first rinsing liquid treating post-step c5 to the extent of E2, and avoids the overlapping of the second chemical liquid carrying post-step c6 with the steps following the second chemical liquid carrying post-step c6.

Then, recipe producing unit 51 determines a recipe for the third wafer set in such a manner that the carrying steps a2-a12, b2-b12, and c2-c12 are not temporally overlapped with each other and the first rinsing liquid treating steps a5, b5, and c5, and the second rinsing liquid treating steps b9, b9, and c9 are not temporally overlapped with each other. Herein, when the time for the processing step for the third wafer set is shortened to avoid the overlapping of the carrying post-steps c6, c8, c10, and c12 following the first rinsing liquid treating post-step c5, the first rinsing liquid treating post-step c5 is extended and the carrying post-steps c6, c8, c10, and c12 are shifted.

Also, when the carrying post-steps c10 and c12 whose overlapping is avoided are performed after the second rinsing liquid treating post-step c9, the second rinsing liquid treating post-step c9, instead of the first rinsing liquid treating post-step c5, may be extended, or both the first rinsing liquid treating post-step c5 and the second rinsing liquid treating post-step c9 may be extended. Herein, when the first rinsing liquid treating post-step c5 and the second rinsing liquid treating post-step c9 are extended, the sum of the extended times of the first rinsing liquid treating post-step c5 and the second rinsing liquid treating post-step c9 equals to the shifted times of the carrying steps.

In relation to this, in the present embodiment, since the processing time for the third wafer set is not shortened by avoiding the overlapping of the carrying post-steps c6, c8, c10, and c12 following the rinsing liquid treating post-steps c5 and c9, compared to the case when the overlapping is not avoided, recipe producing unit 51 produces a recipe which is determined in such a manner that the carrying steps a2-a12, b2-b12, and c2-c12 are not temporally overlapped with each other and the first rinsing liquid treating steps a5, b5, and c5, and the second rinsing liquid treating steps a9, b9, and c9 are not temporally overlapped with each other without shift or extension of the steps included in the recipe.

As described above, in the present embodiment, since the processing on the second wafer set can be performed temporally ahead while avoiding the overlapping of steps, it is possible to improve the throughput in successive processing of wafer sets (see FIGS. 5a and 5b). Also, in the present embodiment, since a rinsing liquid treating step is set as the extended step, it is possible to prevent the extension's bad influence on the wafer.

In the above described aspect of the present embodiment, although ozone water supply unit 71 is used during both the wafer processing in first rinsing liquid treating unit 40 and the wafer processing in second rinsing liquid treating unit 45, the present disclosure is not limited thereto. For example, in another aspect, during all of the wafer processing in first rinsing liquid treating unit 40, the wafer processing in second rinsing liquid treating unit 45, and the wafer processing in the third rinsing liquid treating unit 61, ozone water supply unit 71 may be used.

In this case, in order to avoid the temporal overlapping of the second carrying steps a2-a12, b2-b12, and c2-c12 with each other, and the temporal overlapping of the first rinsing liquid treating steps a5, b5, and c5, the second rinsing liquid treating steps a9, b9, and c9, and the third rinsing liquid treating steps with each other, the rinsing liquid treating mid-steps b5 and b9 are extended, thereby avoiding the overlapping of the carrying mid-steps b6, b8, b10, and b12, or the rinsing liquid treating post-steps c5, and c9 are extended, thereby avoiding the overlapping of the carrying post-steps c6, c8, c10, and c12.

Also, the ozone water may be used by mixing with the chemical liquid. In this case, the rinsing liquid treating mid-steps b5 and b9 are extended to avoid the overlapping of the carrying mid-steps b6, b8, b10, and b12, or the rinsing liquid treating post-steps c5, and c9 are extended to avoid the overlapping of the carrying post-steps c6, c8, c10, and c12, in such a manner that the first chemical liquid treating steps a3, b3, and c3 are not temporally overlapped with each other (when first chemical liquid treating unit 30 uses the ozone water), the second chemical liquid treating steps a7, b7, and c7 are not temporally overlapped with each other (when second chemical liquid treating unit 35 uses the ozone water), or the first chemical liquid treating steps a3, b3, and c3 and the second chemical liquid treating steps a7, b7, and c7 are not temporally overlapped with each other (when both first chemical liquid treating unit 30 and second chemical liquid treating unit 35 use the ozone water).

Third Embodiment

Figure 6:
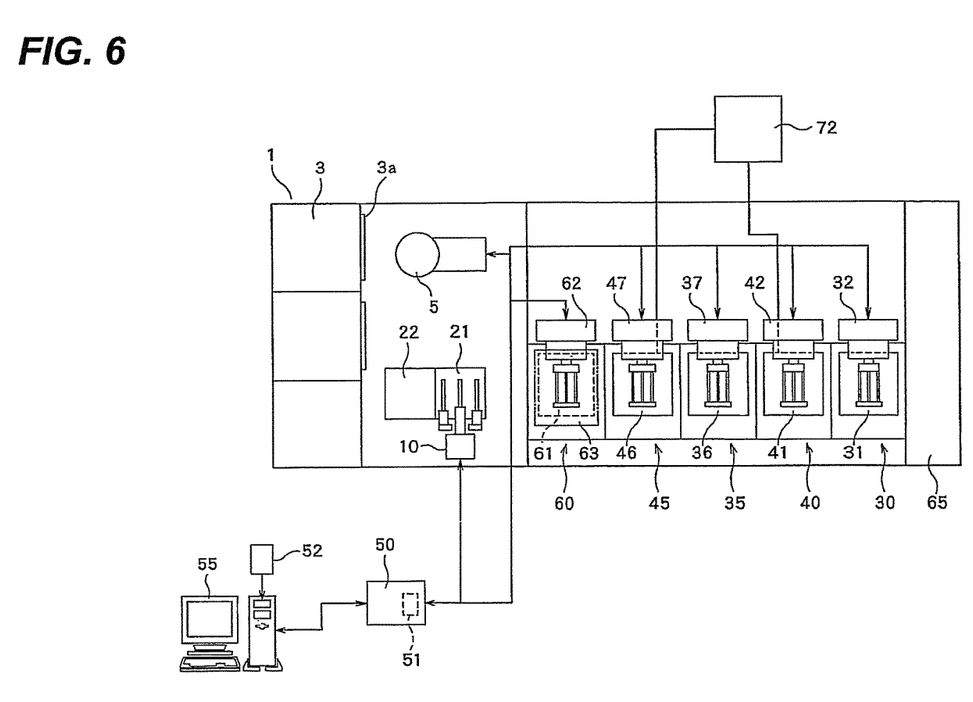
FIG. 6 is a schematic view illustrating the configuration of a treating apparatus according to a third embodiment of the present disclosure.

Hereinafter, the third embodiment of the present disclosure will be described with reference to FIG. 6. The treating apparatus according to the third embodiment, as shown in FIG. 6, includes a heated DIW supply unit 72 for supplying heated deionized water to first rinsing liquid treating unit 40 and second rinsing liquid treating unit 45, instead of ozone water supply unit 71 for supplying the ozone water to first rinsing liquid treating unit 40 and second rinsing liquid treating unit 45. Heated DIW supply unit 72, like second carrying device 10, functions as a common handling unit. Other configurations are almost the same as those of the second embodiment shown in FIGS. 4 and 5.

In the third embodiment shown in FIG. 6. the same parts as those in the first embodiment shown in FIGS. 1 to 3a and 3b and the second embodiment shown in FIGS. 4 and 5 are denoted by the same numerals, and their detailed description is omitted.

In the present embodiment, during both the wafer processing in first rinsing liquid treating unit 40 and the wafer processing in second rinsing liquid treating unit 45, heated DIW supply unit 72 is used. Thus, like the second embodiment, not only the carrying steps a2-a12, b2-b12, and c2-c12, but also the first rinsing liquid treating steps a5, b5, and c5 and the second rinsing liquid treating steps a9, b9, and c9 are adjusted to be not temporally overlapped.

Accordingly, in the present embodiment, the same effects as those described in the second embodiment can be achieved, and a bad influence on the wafer is not caused. Also, it is possible to improve the throughput in successive processing of wafer sets.

Fourth Embodiment

Hereinafter, the fourth embodiment of the present disclosure will be described with reference to FIG. 7. The treating apparatus according to the third embodiment, shown in FIG. 7, further includes a stripping liquid treating mechanism 80 for treating a wafer set with a stripping liquid. In the present embodiment, stripping liquid treating mechanism 80, together with the rinsing liquid treating units 40 and 45, constitutes an extendable liquid treating mechanism. Other configurations are almost the same as those of the first embodiment shown in FIGS. 1 to 3a and 3b.

Figure 7:
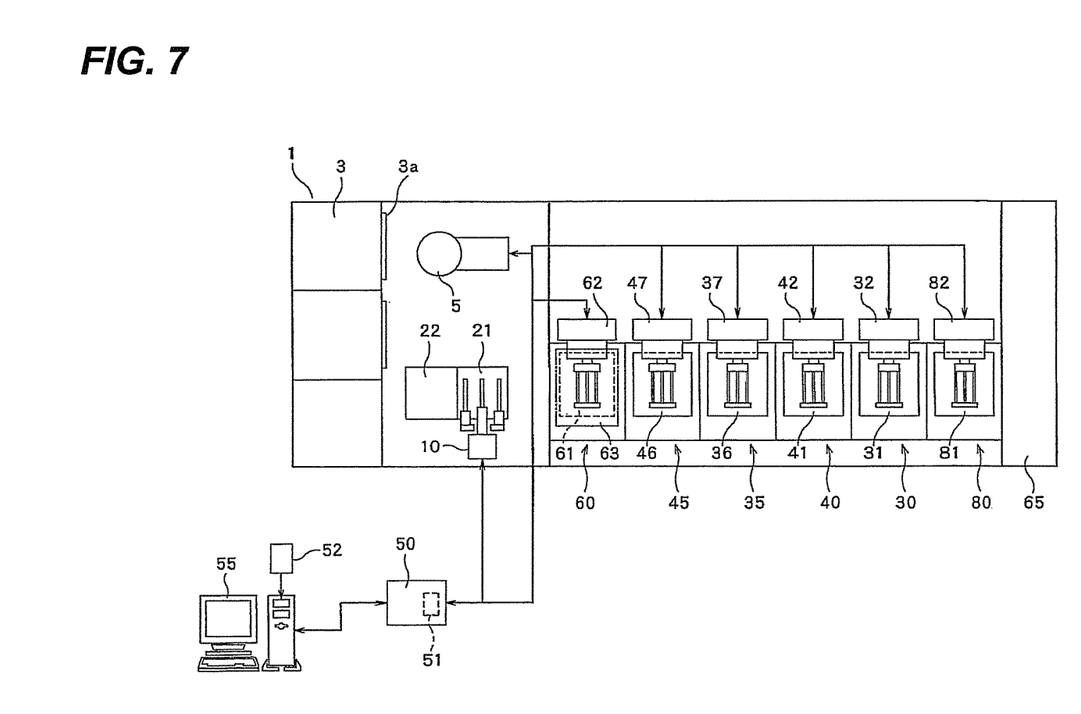
FIG. 7 is a schematic view illustrating the configuration of a treating apparatus according to a fourth embodiment of the present disclosure.

In the fourth embodiment shown in FIG. 7. the same parts as those in the first embodiment shown in FIGS. 1 to 3a and 3b are denoted by the same numerals, and their detailed description is omitted.

In the present embodiment, between the loader loading steps a1, b1, and c1 in which multiple wafer sets are loaded on loader part 21 and the first chemical liquid carrying steps a2, b2, and c2 in which a wafer set lifted up from loader part 21 are carried to first chemical liquid treating unit 30, the wafer set is treated with the stripping liquid by stripping liquid treating mechanism 80 (a stripping liquid treating step). Stripping liquid treating mechanism 80 has a stripping liquid reservoir 81 storing the stripping liquid, and a stripping liquid elevating device 82 for receiving the wafer set from second carrying device 10 and carrying the wafer set into stripping liquid reservoir 81.

In such a stripping liquid, since the object to be stripped is predetermined, there is no concern that wafers are over-etched even when the wafers are dipped in the stripping liquid for a time longer than a prearranged time. Thus, not only in rinsing liquid treating units 40 and 45, but also in stripping liquid treating mechanism 80, the processing steps can be extended.

Accordingly, when one carrying step for handling one target object by second carrying device 10 and another carrying step for handling another target object by second carrying device 10 are temporally overlapped with each other, recipe producing unit 51 extends the stripping liquid treating step for another target object and shifts other carrying steps temporally following the stripping liquid treating step to an extent that the stripping liquid treating step is extended, or extends the rinsing liquid treating step and shifts other carrying steps temporally following the rinsing liquid treating step to an extent that the rinsing liquid treating step is extended, thereby avoiding the temporal overlapping of one carrying step with another carrying step.

Therefore, in the present embodiment, since there is no bad influence on the wafer, it is possible to improve the throughput in successive processing of wafer sets. Also, in the present embodiment, there is an advantage that since the stripping liquid treating step is carried out prior to the first chemical liquid carrying step, the number of carrying step objects capable of being shifted is more than that of the first embodiment. In other words, in the first embodiment, the carrying steps capable of being shifted are the carrying steps after the second chemical liquid carrying steps a6 and b6, while in the present embodiment, the carrying steps capable of being shifted are the carrying steps after the first chemical liquid carrying step b2 and c2. Accordingly, since the first chemical liquid carrying steps b2 and c2 and the first rinsing liquid carrying steps b4 and c4 can be shifted, the present embodiment is more advantageous than the first embodiment.

As the stripping liquid for the present embodiment, for example, SPM (a mixed liquid of $H_2SO_4$ and $H_2O_2$) or SPOM (a mixed liquid of $H_2SO_4$ and $O_3$) may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising:
   a plurality of processing chambers each including a liquid reservoir and an elevating arm, and configured to perform various processes including an extendable liquid processing in which a first target object and a second target object each including a set of wafers are processed with a liquid;

a wafer carrier including a wafer arm configured to sequentially handle the first target object and the second target object in a predetermined order;

a recipe generator including a first processor configured to generate a recipe capable of performing a series of processes including the extendable liquid processing for each of the first target object and the second target object by the plurality of processing chambers, and a common handling to handle the first target object and the second target object by the wafer carrier;

a controller including a second processor and the recipe generator, and configured to control the plurality of processing chambers, the wafer carrier and the recipe generator, wherein the controller is programmed to control the plurality of processing chambers, the wafer carrier and the recipe generator such that when it is determined by the recipe generator that a first common handling to handle the first target object by the wafer carrier and a second common handling to handle the second target object by the wafer carrier are temporally overlapped with each other, the recipe generator generates a new recipe for the second target object in which the extendable liquid processing for the second target object is extended so that the extendable liquid processing is prolonged while the wafer carrier carries the first target object, and all remaining processes of the second target object temporally following the extendable liquid treatment are shifted to an extent that the extendable liquid processing is extended so as to avoid the temporal overlapping of the first common handling with the second common handling.

2. The processing apparatus as claimed in claim 1, wherein at least one of the plurality of processing chambers is a chemical liquid processing chamber to process the first target object and the second target object with a chemical liquid, wherein the recipe generator produces the recipe further comprising a chemical liquid processing to process the first target object and the second target object by the chemical liquid processing chamber.

3. The processing apparatus as claimed in claim 1, wherein at least one of the plurality of processing chambers is an extendable liquid processing chamber performing a rinsing liquid processing to process the first target object and the second target object with a rinsing liquid.

4. The processing apparatus as claimed in claim 1, wherein at least one of the plurality of processing chambers is an extendable liquid processing chamber performing a stripping liquid processing to process the first target object and the second target object with a stripping liquid.

5. The processing apparatus as claimed in claim 2, wherein the wafer carrier comprises an ozone water supplier configured to supply ozone water to the chemical liquid processing chamber.

6. The processing apparatus as claimed in claim 3, wherein the wafer carrier comprises an ozone water supplier configured to supply ozone water to the extendable liquid processing chamber to perform the rinsing liquid processing.

7. The processing apparatus as claimed in claim 3, wherein the wafer carrier comprises a heated DIW supplier configured to supply heated deionized water to the extendable liquid processing chamber to perform the rinsing liquid processing.

8. The processing apparatus as claimed in claim 1, wherein the wafer carrier comprises a carrying device to move the first target object and the second target object.

9. The processing apparatus as claimed in claim 1, wherein the plurality of processing chambers includes multiple extendable liquid processing chambers, and sum of times extended in the multiple extendable liquid processing chambers equals to a shifted time of the common handling.

* * * * *